(12) United States Patent
Willson et al.

(10) Patent No.: US 7,691,275 B2
(45) Date of Patent: Apr. 6, 2010

(54) USE OF STEP AND FLASH IMPRINT LITHOGRAPHY FOR DIRECT IMPRINTING OF DIELECTRIC MATERIALS FOR DUAL DAMASCENE PROCESSING

(75) Inventors: C. Grant Willson, Austin, TX (US);
Frank Palmieri, Austin, TX (US);
Yukio Nishimura, Yokkaichi (JP);
Stephen C. Johnson, Austin, TX (US);
Michael D. Stewart, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 745 days.

(21) Appl. No.: 11/363,071

(22) Filed: Feb. 27, 2006

(65) Prior Publication Data
US 2006/0261518 A1 Nov. 23, 2006

Related U.S. Application Data

(60) Provisional application No. 60/657,145, filed on Feb. 28, 2005.

(51) Int. Cl.
*H01L 21/302* (2006.01)
(52) U.S. Cl. .................. 216/13; 216/18; 216/41; 216/44; 216/52; 216/88; 438/638; 438/692; 438/700
(58) Field of Classification Search .................. None
See application file for complete search history.

(56) References Cited

U.S. PATENT DOCUMENTS

| | | | | |
|---|---|---|---|---|
| 5,484,867 | A * | 1/1996 | Lichtenhan et al. | 528/9 |
| 5,949,130 | A * | 9/1999 | Fukuyama et al. | 257/632 |
| 6,576,345 | B1 * | 6/2003 | Van Cleemput et al. | 428/447 |
| 6,873,026 | B1 * | 3/2005 | Brunemeier et al. | 257/508 |
| 7,396,475 | B2 * | 7/2008 | Sreenivasan | 216/2 |
| 7,468,330 | B2 * | 12/2008 | Allen et al. | 438/780 |
| 2004/0137734 | A1 * | 7/2004 | Chou et al. | 438/689 |
| 2004/0224261 | A1 * | 11/2004 | Resnick et al. | 430/311 |

(Continued)

OTHER PUBLICATIONS

Choi, Jiwon; "Organic/Inorganic Hybrid Epoxy Nanocomposites from Aminophenylsilsesquioxanes;" Macromolecules, vol. 37, No. 1, 2004, pp. 99-109. Publ on Web Dec. 2003.

(Continued)

*Primary Examiner*—Anita K Alanko
(74) *Attorney, Agent, or Firm*—Fish & Richardson P.C.

(57) ABSTRACT

In some embodiments, the present invention is directed to methods that involve the combination of step-and-flash imprint lithography (SFIL) with a multi-tier template to simultaneously pattern multiple levels of, for example, an integrated circuit device. In such embodiments, the imprinted material generally does not serve or act as a simple etch mask or photoresist, but rather serves as the insulation between levels and lines, i.e., as a functional dielectric material. After imprinting and a multiple step curing process, the imprinted pattern is filled with metal, as in dual damascene processing. Typically, the two printed levels will comprise a "via level," which is used to make electrical contact with the previously patterned under-level, and a "wiring level." The present invention provides for the direct patterning of functional materials, which represents a significant departure from the traditional approach to microelectronics manufacturing.

27 Claims, 10 Drawing Sheets

U.S. PATENT DOCUMENTS

| | | | |
|---|---|---|---|
| 2005/0031964 A1* | 2/2005 | Babich et al. | 430/5 |
| 2005/0064344 A1* | 3/2005 | Bailey et al. | 430/320 |
| 2005/0202350 A1* | 9/2005 | Colburn et al. | 430/320 |
| 2006/0138080 A1* | 6/2006 | Hasegawa et al. | 216/44 |
| 2007/0128850 A1* | 6/2007 | Terasaki et al. | 438/629 |
| 2007/0185298 A1* | 8/2007 | Baikerikar et al. | 528/31 |
| 2007/0238317 A1* | 10/2007 | Allen et al. | 438/778 |
| 2008/0277826 A1* | 11/2008 | Chou et al. | 264/293 |

OTHER PUBLICATIONS

Colburn, M.; "Step and Flash Imprint Lithography: A New Approach to High-Resolution Patterning:" Proceedings of SPIE, vol. 3676, pp. 379-389, 11 pages.

Johnson, S.; "Fabrication of Multi-Tiered Structures on Step and Flash Imprint Lithograph Templates;" Microelectronic Engineering 67-68, 2003, pp. 221-228.

Kondo, Seiichi; "An Imprint Damascene Process for Cu/low-k Interconnects;" Advanced Metallization Conference, Oct. 1-3, 2002, San Diego, CA, and Oct. 29-30, 2002, University of Tokyo, Tokyo, Japan, 8 pages.

Li, Mingtao; "Fabrication of Circular Optical Structures with a 20 nm minimum feature size using nanoimprint lithography;" Appl. Phys. Ltrs., vol. 76, No. 6, Feb. 7, 2000, pp. 673-675.

McMackin, Ian; "Design and Performance of a Step and Repeat Imprinting Machine;" Proceedings of SPIE, vol. 5037, pp. 176-186, 9 pages, 2003.

McMackin, Ian; "Step and Repeat UV Nanoimprint Lithography Tools and Processes;" Proceedings of SPIE, vol. 5374, Bellingham, WA, 2004, pp. 222-231.

Resnick, D.J.; "Imprint Lithography for Integrated Circuit Fabrication," J. Vac. Sci. Technol. B 21(6), Nov./Dec. 2003, pp. 2624-2631.

Rolland, Jason P.; "Solvent-Resistant Photocurable 'Liquid Teflon' for Microfluidic Device Fabrication;" J. Am. Chem. Soc., Feb. 2004, 2 pages.

Seekamp, J.; "Nanoimprinted Passive Optical Devices;" Institute of Physics Publishing, Nanotechnology 13, 2002, pp. 581-586. Sept. 2002.

Stewart, Michael D.; "Direct Imprinting of Dielectric Materials for Dual Damascene Processing;" SPIE Microlithography Conference, Mar. 2, 2005, 9 pages.

Vu, Zhaoning; "Fabrication of Large Area 100 nm Pitch Grating by Spatial Frequency Doubling and Nanoimprint Lithography for Subwavelength Optical Applications;" J. Vac. Sci Technol. B 19 (6), Nov./Dec. 2001, pp. 2816-2819.

Zhang, Chunxin; Hydrosilylation of Allyl Alcohol with [HSiMe20Si01.5]8: Octa (3-hydroxypropyldimethylsiloxy) octasilsesquioxane and its Octamethacrylate Derivative as Potential Precursors to Hybrid Nanocomposites; J. Am. Chem. Soc., 122, pp. 6979-6988, Jun. 2000.

* cited by examiner

A)

B)

USE OF STEP AND FLASH IMPRINT LITHOGRAPHY FOR DIRECT IMPRINTING OF DIELECTRIC MATERIALS FOR DUAL DAMASCENE PROCESSING

RELATED APPLICATIONS

This Application for Patent claims priority benefit to U.S. Provisional Patent Application Ser. No. 60/657,145, filed Feb. 28, 2005.

This invention was made with support from the Advanced Materials Research Center (AMRC), Grant No. 309340; and the Defense Advanced Research Projects Agency (DARPA), Grant No. N66-001-01-1-8964.

FIELD OF THE INVENTION

This invention relates generally to lithography methods, and specifically to the use of step-and-flash imprint lithography (SFIL) for dual damascene processing.

BACKGROUND

Advanced microprocessors require several (e.g., eight or more) levels of wiring in addition to the transistor gate level. Each wiring level is stacked over the previous level with connections to the levels above and below made through via layers. The dual damascene approach to fabricating these interconnected structures creates a wiring level and a via/contact level simultaneously, and thereby reduces the total number of processing steps. A damascene approach is a necessity when copper is the conductor metal because there are no effective plasma etch processes available for copper. By patterning two layers and then filling both with metal, the dual damascene approach, of which there are several variations, reduces the total number of process steps; however, this method still requires around twenty process steps per wiring layer.

The basic step-and-flash imprint lithography (SFIL) process uses a photocurable imprint resist which is dispensed as a monomeric liquid and is cured while in contact with the template (Colburn, M.; Johnson, S.; Stewart, M.; Damle, S.; Bailey, T. C.; Choi, B.; Wedlake, M.; Michaelson, T.; Sreenivasan, S. V.; Ekerdt, J.; Willson, C. G., *Proc. SPIE-Int. Soc. Opt. Eng.* 1999, 3676, 379). The role of the imprint resist is only to act as an etch mask or barrier for transfer of the imprinted pattern into an underlying "transfer layer." This imprint resist, or etch barrier, serves the same purpose as photoresist in a traditional photolithographic process. After the printed pattern is transferred to the substrate, any remaining resist is usually removed or stripped. Imprint resists can be used like traditional photoresists to serve as a masking layer, but since the imprint process directly generates topography, it potentially simplifies the process of creating a "functional" material that could serve as part of the final device or the device itself. For example, nanoimprint techniques can be used to make diffractive optical elements (Li, M.; Wang, J.; Zhuang, L.; Chou, S. Y., *Appl. Phys. Lett.* 2000, 76, 673; Seekamp, J.; Zankovych, S.; Helfer, A. H.; Maury, P.; Sotomayor-Torres, C. M.; Boettger, G.; Liguda, C; Eich, M.; Heidari, B.; Montelius, L.; Ahopelto, J. *Nanotechnology* 2002, 13, 581-586; Yu, Z.; Wu, W.; Chen, L.; Chou, S. Y., *J. Vac. Sci. Technol. B* 2001, 19, 2816) or directly pattern channels for microfluidic devices (Rolland, J. P.; Van Dam, R. M.; Schorzman, D. A.; Quake, S. R.; DeSimone, J. M., *J. Am. Chem. Soc.* 2004, 126, 2322-2323). An imprintable conductive material would allow the direct patterning of wiring circuits; conversely, the ability to pattern an insulator or dielectric material would provide a good starting point for a damascene-like process. As SFIL lithography technology matures, a broader set of imprint materials is becoming available, and many of these uses are being developed.

As a result of the foregoing, a method of combining SFIL with a damascene process to make multi-tiered structures for a multi-level device would be very attractive, particularly from an economic standpoint.

SUMMARY OF THE INVENTION

In some embodiments, the present invention is directed to methods that involve the combination of step-and-flash imprint lithography (SFIL) with a multi-tier template to simultaneously pattern multiple levels of, for example, an integrated circuit device. In such embodiments, the imprinted material generally does not serve or act as a simple etch mask or photoresist, but rather serves as the insulation between levels and lines, i.e., as a functional dielectric material. After imprinting and a curing process, the imprinted pattern is filled with metal, as in dual damascene processing. Typically, the two printed levels will comprise a "via level," which is used to make electrical contact with the previously patterned underlevel, and a "wiring level." The present invention provides for the direct patterning of functional materials, which represents a significant departure from the traditional approach to microelectronics manufacturing.

In some embodiments, such above-described methods comprise the following steps: (a) dispensing a quantity of dielectric precursor liquid onto a substrate, wherein the substrate has been treated with an adhesion promoter; (b) pressing a multi-tiered template into the dielectric precursor liquid as it resides on the substrate, wherein the multi-tiered template is lithographically-generated, and wherein the multi-tiered template has been treated with a fill/release agent; (c) photo-curing the dielectric precursor liquid as it resides between the substrate and the multi-tiered template to form a template-bound multi-tiered patterned dielectric material; (d) removing the multi-tiered template from the multi-tiered patterned dielectric material to yield a multi-tiered patterned dielectric structure on the substrate; (e) clearing residual material from the multi-tiered patterned dielectric structure, wherein such material otherwise prevents contact with the underlying substrate; (f) thermally curing/baking the multi-tiered patterned dielectric structure; (g) depositing copper in the multi-tiered patterned dielectric structure to form a filled multi-tiered patterned dielectric structure with a copper overfill layer; and (h) removing the copper overlayer with chemical mechanical planarization (CMP).

A key differentiation between methods of the present invention and others is the use of low viscosity dielectric precursors and a multiple step curing process of the functional dielectric material. It should be noted that low viscosity precursors are generally only compatible with SFIL techniques. Typically, an initial curing step uses light to cure the dielectric precursors; after the imprint mold is removed, the imprinted material is thermally cured to bring out its dielectric properties. After the imprint and cure steps, the devices are processed using processing steps common to semiconductor manufacturers, e.g., metallization and chemical mechanical polishing (CMP).

Advantages of the methods of the present invention include: (a) use of low viscosity dielectric precursors for the imprint step allow the SFIL process to be used in the patterning step; (b) the multi-step curing process allows greater materials design flexibility; (c) by patterning two levels at once, there are fewer processing steps when compared to current processing methods; and (d) potentially higher patterning resolution over traditional photolithography.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
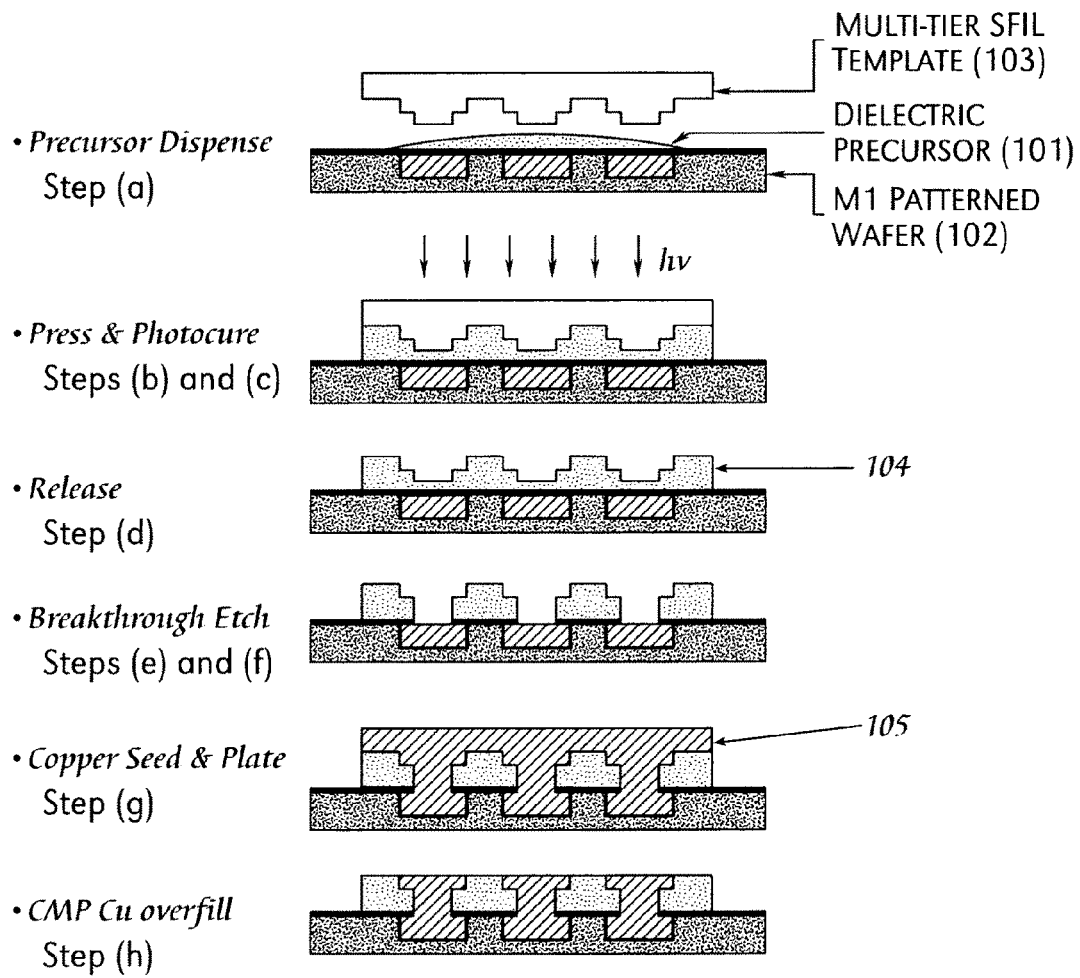
FIG. 1 schematically depicts a multi-tier step-and-flash imprint lithography (SFIL) dual damascene process using functional materials, in accordance with embodiments of the present invention.

In the following description, specific details are set forth such as specific quantities, sizes, etc. to provide a thorough understanding of the present invention. However, it will be obvious to those skilled in the art that the present invention may be practiced without such specific details. In many cases, details concerning such considerations and the like have been omitted inasmuch as such details are not necessary to obtain a complete understanding of the present invention and are within the skills of persons of ordinary skill in the relevant art.

Described herein is an approach to damascene processing that is based on step-and-flash imprint lithography (SFIL). Typically, such imprint damascene processes require less than half as many steps as would a standard photolithographic dual damascene approach. For example, by using an imprint template with two levels of patterning, a single imprint lithography step can replace two separate photolithography steps. In addition to directly reducing the total number of processing steps, patterning two levels simultaneously removes some of the most difficult aspects of the current dual damascene approaches, such as performing a second photolithography step over the topography generated by a first photolithography step. Also, alignment of the via and upper wiring level is performed at the template fabrication stage, so only a single alignment step is required during the device manufacturing stage. When the imprinted material is a functional dielectric, the SFIL approach requires roughly one-third as many steps as standard dual damascene approaches.

There are essentially four requirements for using SFIL in direct patterning of dielectric materials for a dual damascene process: (1) an SFIL tool with overlay and alignment, (2) multi-tier imprint templates with damascene test structures, (3) photocurable dielectrics or dielectric precursors, and (4) an integration of SFIL patterned wafers into a copper process flow.

SFIL-capable tools are commercially available (McMackin, I.; Choi, J.; Schumaker, P.; Nguyen, V.; Xu, F.; Thompson, E.; Babbs, D.; Sreenivasan, S. V.; Watts, M.; Schumaker, N., Proc. SPIE-Int. Soc. Opt Eng. 2004, 5374, 222-231; McMackin, I.; Schumaker, P.; Babbs, D.; Choi, J.; Collison, W.; Sreenivasan, S. V.; Schumaker, N. E.; Watts, M. P. C.; Voisin, R. D., Proc. SPIE-Int. Soc. Opt. Eng. 2003, 5037, 178-186) and multi-tier templates have been previously demonstrated (Johnson, S.; Resnick, D. J.; Mancini, D.; Nordquist, K.; Dauksher, W. J.; Gehoski, K.; Baker, J H.; Dues, L.; Hooper, A.; Bailey, T. C.; Sreenivasan, S. V.; Ekerdt, J. G.; Willson, C. G., Microelectron. Eng. 2003, 67-68, 221-228; Resnick, D. J.; Dauksher, W. J.; Mancini, D.; Nordquist, K. J.; Bailey, T. C.; Johnson, S.; Stacey, N.; Ekerdt, J. G.; Willson, C. G.; Sreenivasan, S. V.; Schumaker, N., J. Vac. Sci. Technol. B, 2003, 21, 2624). While certain aspects of using imprint lithography with a damascene patterning approach have been previously reported (S. Kondo, Y. Anzai, M. Terao, D. Ryuzaki, D. Kodama, T. Furusawa. "An Imprint-Damascene Process for Cu/low-k Interconnects," Proceedings of ULSI, 2003, 17, 537-542), the use of SFIL with multi-tier templates in a combined damascene process has not been described previously.

In SFIL processes, a low viscosity, photocurable solution is dispensed onto a substrate. A rigid, transparent template is then brought into close proximity with the substrate allowing the solution to fill the space between the substrate and the mold. When the solution, comprising low molecular weight monomer and photoinitiator molecules, is exposed to ultraviolet (UV) light, it polymerizes and hardens in the topographic mold. The mold can then be removed leaving a patterned (inverse) replica on the substrate. Advantages of the SFIL process over traditional nanoimprinting include an ability of SFIL to print at room temperature using low pressures (<1 atm), making it easier to achieve overlay and alignment while also printing with high throughput.

In the case of the present invention, the dispensed liquid is a dielectric precursor and not an imprint resist in the formal sense. A schematic of a representative SFIL-dual damascene process, in accordance with some embodiments of the present invention, is shown in FIG. 1.

Referring to FIG. 1, such an above-described process generally comprises the steps of: (Step (a)) dispensing a quantity of dielectric precursor liquid (101) onto a substrate (e.g., M1 patterned wafer, 102), wherein the substrate has been treated with an adhesion promoter; (Step (b)) pressing a multi-tiered template (103) into the dielectric precursor liquid as it resides on the substrate, wherein the multi-tiered template is lithographically-generated, and wherein the multi-tiered template has been treated with a fill/release agent; (Step (c)) photo-curing (first curing process) the dielectric precursor liquid as it resides between the substrate and the multi-tiered template to form a template-bound multi-tiered patterned dielectric material (104); (Step (d)) removing the multi-tiered template from the multi-tiered patterned dielectric material to yield a multi-tiered patterned dielectric structure on the substrate; (Step (e)) clearing residual material from the multi-tiered patterned dielectric structure, wherein such material otherwise prevents contact with the underlying substrate; (Step (f)) thermally curing/baking (second curing process) the multi-tiered patterned dielectric structure; (Step (g)) depositing copper (105) in the multi-tiered patterned dielectric structure to form a filled multi-tiered patterned dielectric structure with a copper overfill layer; and (Step (h)) removing the copper overlayer with chemical mechanical planarization (CMP). Note, however, that in some embodiments, Step (f) could be done prior to Step (e).

Generally, the dielectric precursor liquid can be of any composition of suitable viscosity that can be cured through a combination of photo- and thermal-curing so as to form a multi-tiered patterned dielectric material. In some embodiments, such materials are generally a low viscosity liquid prior to polymerization, i.e., in their precursor state. The liquid can be dispensed onto a substrate in droplets of controlled volume and position. The liquid typically vitrifies by polymerization when exposed to electromagnetic radiation (first curing step). Shrinkage of the liquid precursor during exposure and imprinting should typically be less than about 10%. Mechanical properties of the polymer film allow for selective separation of the template from the imprinted polymer film. After the photo-induced polymerization, a thermally-induced crosslinking reaction is used to further improve material properties of the polymer film (second curing step). Thermal processing is generally performed at temperatures between 100° C. and 450° C. Thermal crosslinking causes minimal densification or shrinkage of the polymer film. Final properties of the film typically include: high thermal stability (e.g., 400° C.), low dielectric constant (<4), good mechanical properties, low coefficient of thermal expansion, and low water absorption.

Generally, such above-described dielectric precursors comprise polymerizable/crosslinkable functional groups. In some embodiments, the polymerizable/crosslinkable functional groups may be pendent to a monomer building block. In some or other embodiments, one or more functional groups may be appended to each monomer building block. The structure of the monomer building block, if incorporated, includes, but is not limited to, species selected from the group consisting of polyhedral oligomeric silsesquioxanes (POSS), alkoxysilanes, oligomeric alkoxysilane prepolymers, and combinations thereof. Additionally, the dielectric precursor material generally comprises photosensitive functional groups including, but not limited to, acrylates, methacrylates, thiol-ene systems, epoxies, oxiranes, vinyl systems, and maleimides. The photo-polymerization of the material may be initiated by a photoactive compound including, but not limited to photo-acid generators, photo-base generators, and free radical generators. The material must also contain some thermally initiated polymerizable functionality. These functional groups include, but are not limited to benzocyclobutane, alkoxysilanes, silanes, maleimides, and nadic imides.

An exemplary dielectric precursor liquid formulation is as follows: polyhedral oligomeric silsesquioxane (POSS) octahedral cage functionalized with benzocyclobutane and methacrylate units with an averaged 5:3 ratio. This formulation includes up to 10 percent (by weight) UV free radical generator such as 2-hydroxy-2-methyl-1-phenyl-propan-1-one (Ciba-Geigy, Darocure 1173).

While the substrate material is not specifically limited, the substrate is generally compatible with both standard fabrication techniques and SFIL techniques. Suitable substrates include, but are not limited to, those based on silicon wafers, and such substrates generally comprise an adhesion promoter. The adhesion promoter functions to facilitate adhesion of the patterned multi-tiered dielectric structure to the substrate. An exemplary such adhesion promoter is aminopropylsilane.

Suitable templates are generally multi-tiered versions of standard SFIL templates described previously. In general, such templates must be transmissive of UV radiation so as to permit UV curing of the functional dielectric precursor material, and such templates generally may be coated with a fill/release agent. The fill/release agent serves to facilitate release of the template from the UV-cured functional dielectric material, such that a patterned multi-tiered dielectric structure remains on the substrate after release. Examples of such multi-tiered templates are described in EXAMPLE 1.

Photo-curing is typically carried out using UV radiation, but other regions of the electromagnetic (EM) spectrum could additionally or alternatively be employed. In some embodiments, such curing is generally carried out so as only to partially cure the dielectric precursor material such that it can be sufficiently separated from the multi-tiered template (first curing step).

The clearing of residual dielectric material generally comprises a plasma etch. The specifics of such an etch are dependent on the type of dielectric material employed. For silicon-based dielectrics, such an etch is typically a fluorine-based plasma etch. In this latter case, the etch products are volatile (e.g., $SiF_4$) and easily removed.

Thermally curing/baking (second curing step) is highly materially-dependent. Generally, the curing/baking temperature is close to, but nevertheless below the thermal decomposition temperature of the functional dielectric material. Typically, such curing/baking temperatures are between about 100° C. and about 450° C.

The deposition of copper plating seed is typically done via a physical vapor deposition (PVD) means. The main portion of the copper is deposited by electroplating from solution. An example of such deposition is provided in EXAMPLE 4. Removing the copper overlayer is typically done using standard CMP methods well-known to those of skill in the art. This process is also described in EXAMPLE 4.

There are many different versions of imprint lithography and each has advantages and disadvantages, but SFIL was designed from the beginning with microelectronic device manufacturing in mind. By virtue of simplicity, any nanoimprint technique is likely to be less expensive and more flexible than extreme UV (EUV) lithography. One of the chief concerns with nanoimprint lithography is the availability and expense of 1X templates (masks), but this should be less of an issue in back-end-of-line (BEOL) processing as the highest resolution patterning technology required to pattern gate levels and first contacts are not required for every level. As a rough guideline, each wiring level increases the feature size of the previous level by one factor, such that at the 90 nm node the third wiring level would have minimum features around 270 nm. This is in the range achievable with fast mask writing technologies which should keep template costs low. When template making processes improve, imprint will become competitive for even the most demanding levels. Also favoring the development of imprint for BEOL processing is that the materials constraints for higher metal levels are less rigorous. This lessens the difficulty of the initial development of useful imprintable dielectrics, but with a dual curing imprintable dielectric, there is no reason that the materials properties of imprintable dielectrics should not approach the requirements for all levels.

The following examples, drawn from an initial feasibility demonstration, are included to demonstrate particular embodiments of the present invention. It should be appreciated by those of skill in the art that the methods disclosed in the examples that follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

Example 1

This Example describes the source and manufacture of multi-tier SFIL templates, in accordance with some embodiments of the present invention.

Figure 2:
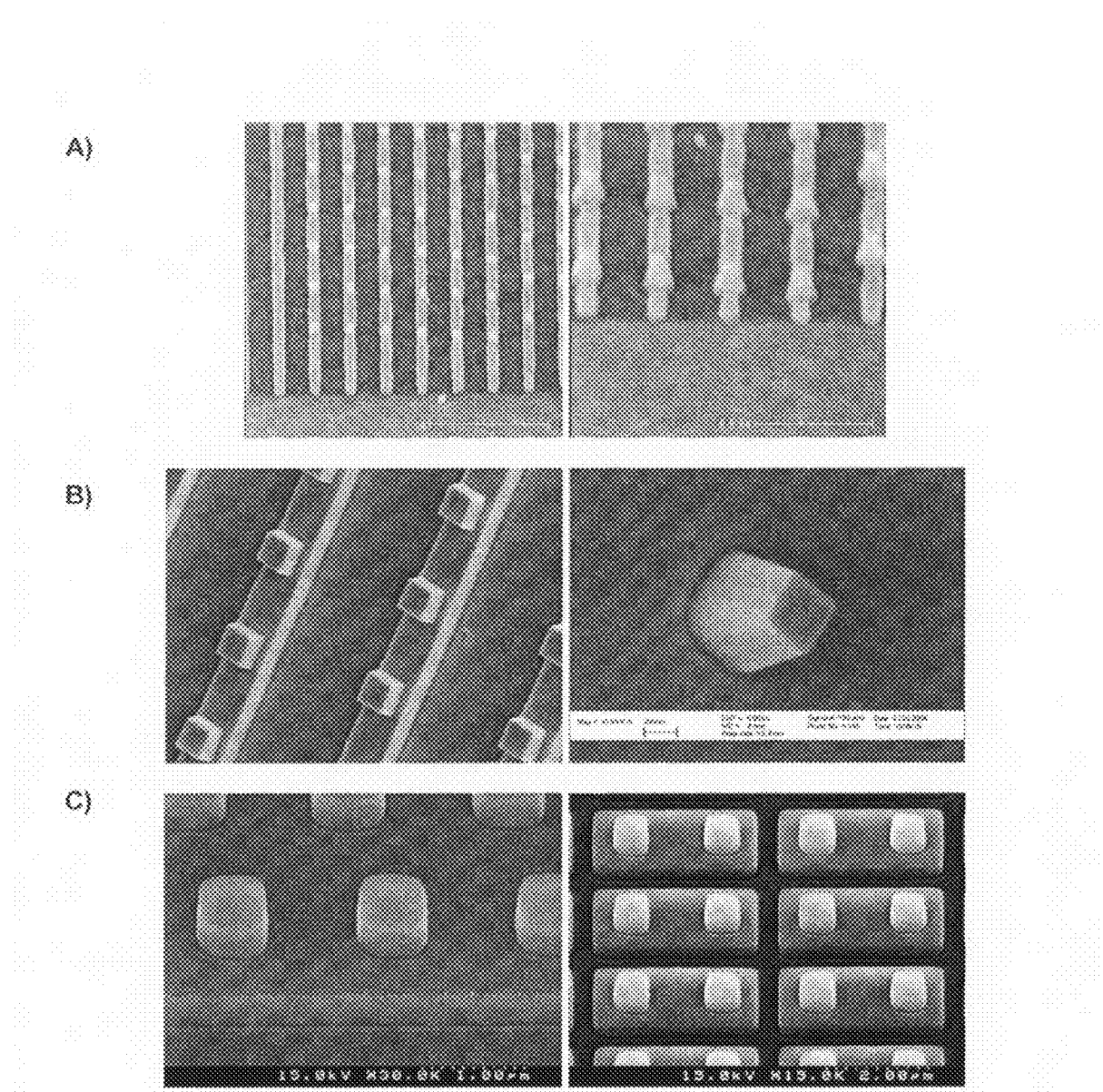
FIGS. 2A-2C are scanning electron microscopy (SEM) images of multi-tier templates suitable for use in some embodiments of the present invention, where (A) depicts a Motorola-fabricated template with 100 nm diameter vias on 100 nm lines; (B) depicts a LBNL-fabricated template with 1000 nm square vias on 2000 nm lines (left) and 250 nm via post with aspect ratio exceeding 2:1 (right); and (C) depicts a DPI-fabricated template with 500 nm diameter vias on a 500 nm tall tier (left) and a via chain structure with 500 nm vias on a 1000 nm×2000 nm base; and where each tier is nominally 500 nm tall.

Multi-tier templates were obtained from three separate sources. Motorola Labs produced templates with features down to 100 nm on both tiers. This template was mainly for multi-tier resolution demonstration and the pattern was not designed for electrical testing. Templates from Lawrence Berkeley National Labs (LBNL) were, like the Motorola templates, patterned with electron beam, but with much larger features. Larger features were chosen to simplify initial process development and eventual electrical testing. The pattern of the LBNL templates contained electrical testing structures like serpentines, inter-digitated combs, and vias connected to probe pads. Templates purchased from DuPont Photomasks, Inc. (DPI) were patterned with a laser mask writer. The design of the DPI template is based on standard dual damascene test vehicle designs used at Sematech. Minimum features were targeted at 500 nm. Electrical test structures include via chains, serpentines, combs, and "Kelvin" structures. Along with the multi-tier template, a single tier template with the corresponding first level pattern was purchased. Scanning electron microscopy (SEM) images of the multi-tier templates, suitable for use in some embodiments of the present invention, are shown in FIGS. 2A-2C, where (A) depicts a Motorola-fabricated template with 100 nm diameter vias on 100 nm lines; (B) depicts a LBNL-fabricated template with 1000 nm square vias on 2000 nm lines (left) and 250 nm via post with aspect ratio exceeding 2:1 (right); and (C) depicts a DPI-fabricated template with 500 nm diameter vias on a 500 nm tall tier (left) and a via chain structure with 500 nm vias on a 1000 nm×2000 nm base; and where each tier is nominally 500 nm tall.

Example 2

This Example serves to illustrate types of photo-curable functional dielectric precursor materials, in accordance with some embodiments of the present invention.

The standard SFIL imprint resist (usually referred to as etch barrier material) is based on photo-induced free radical polymerization. The components of the imprint resist frequently include an organic acrylate, an organic crosslinker, and a silicon containing acrylate monomer, along with an appropriate photoinitiator. For an initial demonstration of direct imprinting of functional dielectrics, a version of standard etch barrier formulation without a silicon-containing component was used as the dielectric precursor. This material functions as an insulator material, but generally lacks thermal stability and device longevity. Other suitable materials offering great potential are based on silsesquioxane chemistry and include, but are not limited to, epoxy-functionalized silsesquioxane cage structures (Zhang, C.; Laine, R. M., *J Am. Chem. Soc.*, 2000, 122, 6979-6988; Seung, J. C.; Kim, G.; Laine, R. M., *Macromolecules*, 2004, 37, 99-109). Such epoxy-functionalized silsesquioxane material can cure with photo-generated acid.

Example 3

This Example serves to illustrate the imprinting of functional dielectric materials in accordance with some embodiments of the present invention.

As a demonstration, imprinting was conducted using several Molecular Imprints, Inc. Imprio 55 and Imprio 100 tools. Certain imprints used for template evaluation and imprint process development were performed on double polished, BARC-coated (Brewer Science, DUV-30J) wafers. Full process demonstration wafers were double-side polished wafers on which copper had been plated on one side to a thickness between 500 nm and 2000 nm. A copper diffusion barrier of silicon-carbonitride approximately 50 nm thick was coated over the plated copper. Before printing, these copper wafers were surface treated using standard techniques to improve adhesion of the imprinted dielectric.

Example 4

This Example serves to illustrate post-imprint processing, in accordance with some embodiments of the present invention.

Herein, multi-tier template fabrication has been further improved to include very intricate circuit designs and very small features and, as a demonstration, a photo-curing dielectric precursor material was used. This initial precursor material is similar to previously-reported SFIL resist formulations. For a start-to-finish demonstration, ADTF, Inc (Austin, Tex.) integrated the SFIL-printed wafers into their 200 mm copper fabrication line. Certain modifications to their standard copper fabrication process were required in order to accommodate the lower thermal stability of the dielectric precursor material used in the demonstration. For example, standard temperatures used for metal deposition and annealing were reduced to accommodate the materials constraints. A low down force chemical-mechanical planarization (CMP) process was also used because the polishing performance of the dielectric was heretofore unknown. With these adjustments, multi-tier SFIL printed wafers were processed through the entire copper dual damascene fabrication process.

After imprinting, the residual layer was cleared and the copper diffusion barrier (SiCN) breached with reactive ion plasma etches. The residual layers are often thin enough that only a short fluorine plasma etch step is required for the residual and barrier layer breakthrough. After breakthrough etching, the wafer was degassed at 200° C. Physical vapor deposition (PVD) was used to deposit 25 nm of tantalum and 130 nm of copper (no argon sputter was done prior to PVD). After the seed layer was deposited, 1200 nm of copper was electroplated to overfill the imprinted features. For these initial samples, a 3-day, room temperature copper "self anneal" was used rather than a quicker high temperature anneal. After annealing, a "low down force" CMP process was used to remove the copper overfill and the tantalum overcoat.

Example 5

In this Example, electron and optical micrographs are provided to further illustrate the embodiments described in EXAMPLES 3 and 4.

Figure 3:
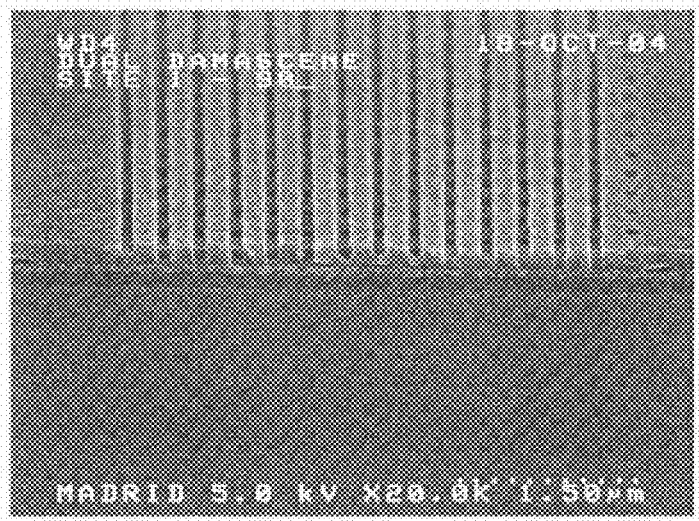
FIGS. 3A and 3B are SEM images depicting imprints of the Motorola-fabricated template with 100 nm features.
Figure 3:
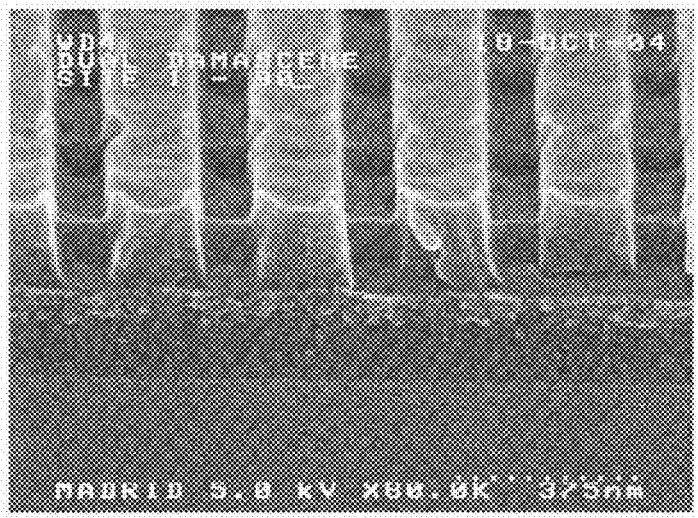
Figure 4:
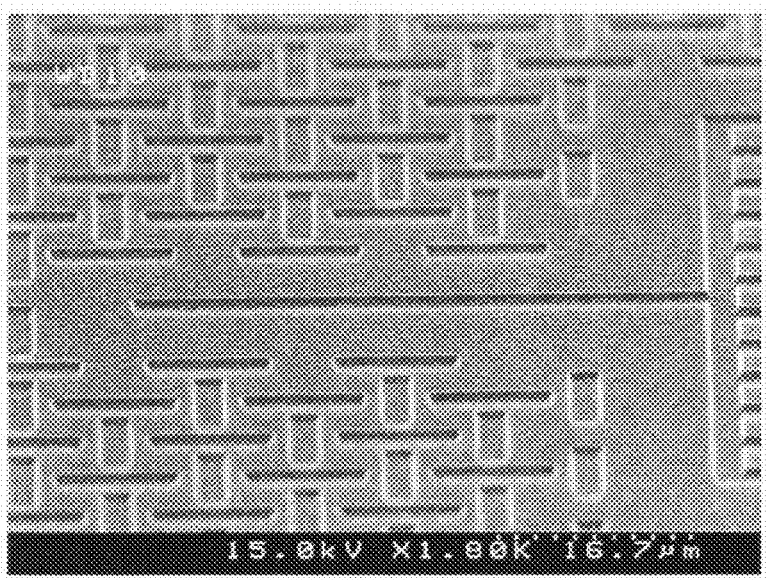
FIGS. 4A and 4B are SEM images depicting imprints of a LBNL-fabricated template.
Figure 4:
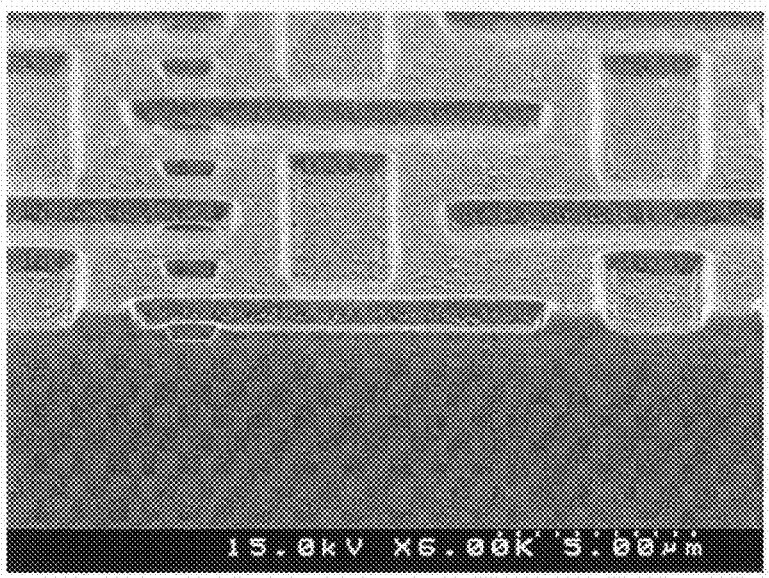
Figure 5:
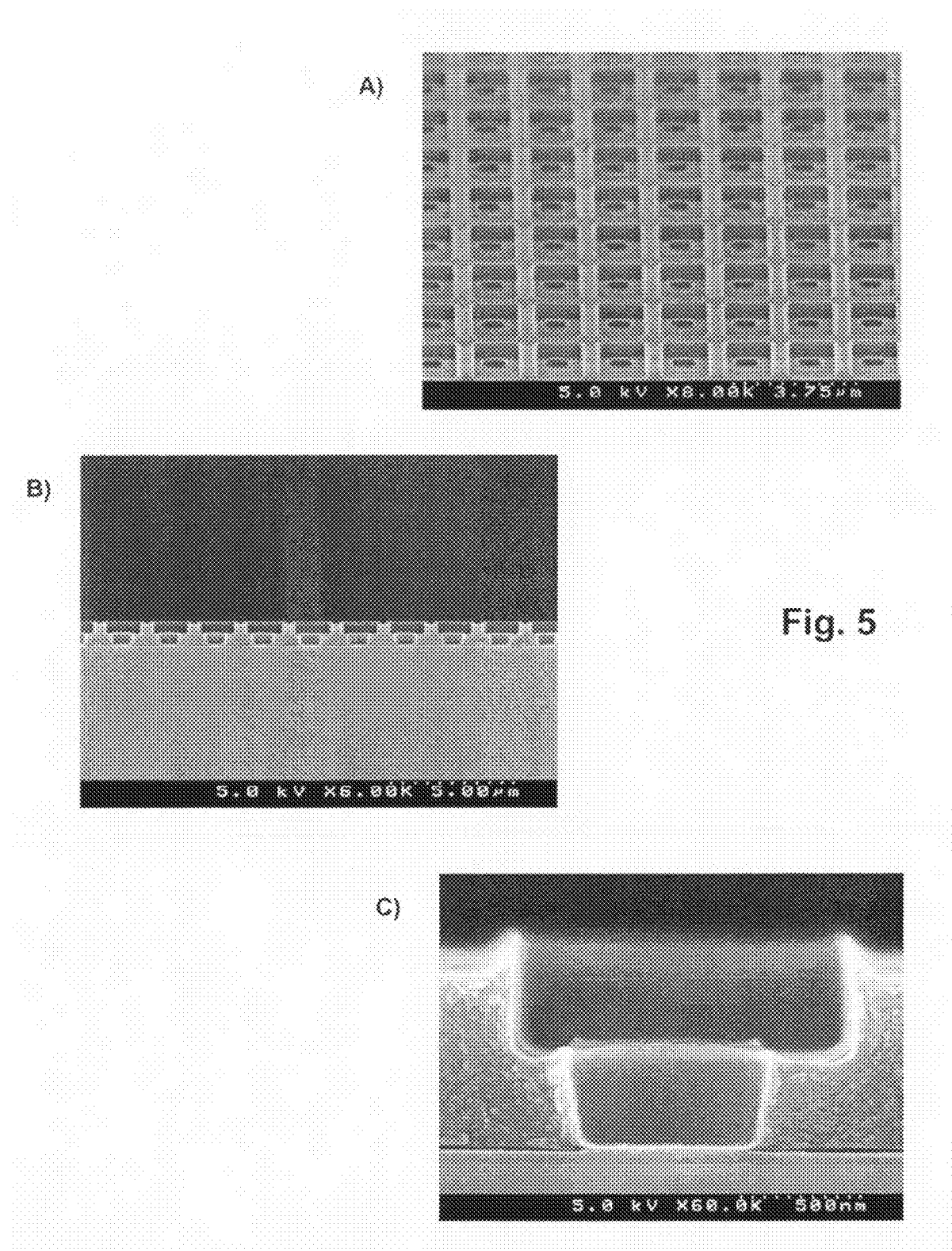
FIGS. 5A-5C are SEM images depicting imprints of a via chain structure on a DPI-fabricated template, where (A) is a tilt overview, (B) is a cross-sectional view, and (C) is a close-up individual via chain feature.

Several examples of multi-tier imprints are shown in FIGS. 3, 4 and 5. FIGS. 3A and 3B are SEM images depicting imprints of the Motorola-fabricated template with 100 nm features. FIGS. 4A and 4B are SEM images depicting imprints of a LBNL-fabricated template. FIGS. 5A-5C are SEM images depicting imprints of a via chain structure on a DPI-fabricated template, where (A) is a tilt overview, (B) is a cross-sectional view, and (C) is a close-up individual via chain feature.

A general feature seen in these multi-tier imprints has been the thinness of residual layer beneath the via points. The structure of the template likely aids the formation of thin residual layers. On the template, vias are raised posts or pins, which cover only a small percentage of the pattern surface. The pin-like protrusions of the template act to concentrate imprint forces and aid monomer flow. Thin residual layers keep the overall loss of dielectric material low during the breakthrough etch steps.

Figure 6:
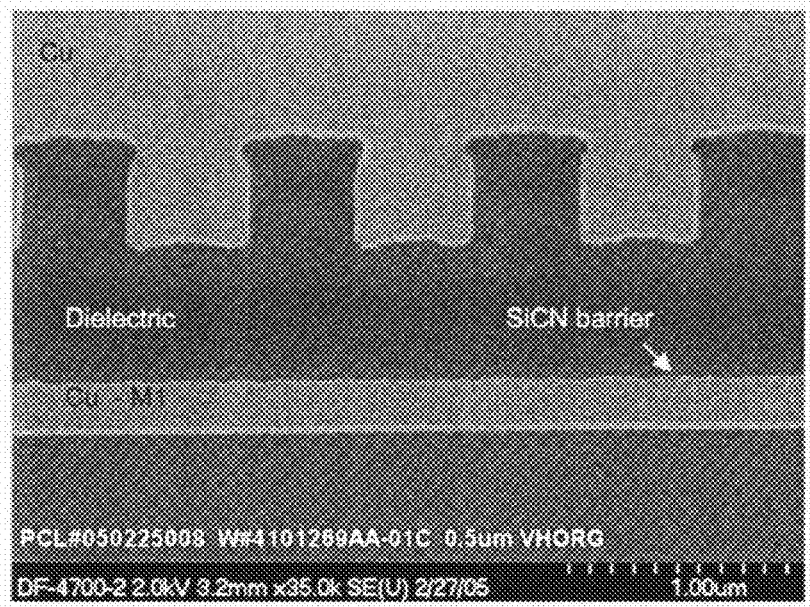
FIGS. 6A and 6B are SEM images depicting copper-filled features prior to chemical mechanical planarization (CMP), where (A) is a cross-section of an upper level serpentine structure, and where (B) is a cross-section of multi-level feature (via chain) indicating that the copper diffusion barrier was not breached prior to plating.
Figure 6:
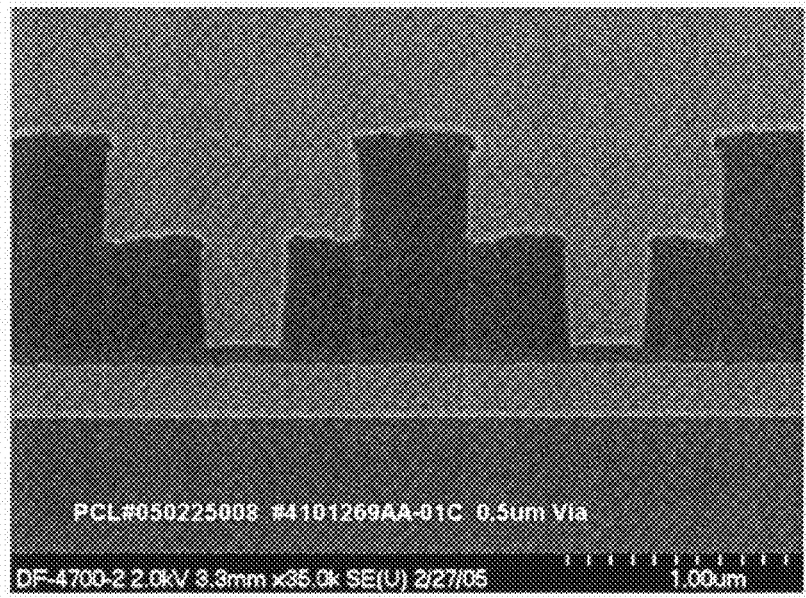

After imprinting, wafers were taken to ATDF to complete the rest of the processing steps. Following breakthrough etch steps, the wafers were coated with tantalum and a copper seed layer. Features were filled with electroplated copper and then polished with low down force CMP process. FIGS. 6A and 6B are SEM images depicting copper-filled features prior to chemical mechanical planarization (CMP), where (A) is a cross-section of an upper level serpentine structure, and where (B) is a cross-section of multi-level feature (via chain) indicating that the copper diffusion barrier was not breached prior to plating.

Optical micrographs of post-CMP wafers are shown in FIGS. 7A and 7B are optical micrographs of post-CMP wafers, where (A) is a serpentine structure and (B) is a Kelvin-like structure, and where a tiling pattern is customary "dummy metal" fill used to maintain constant pattern density over the entire die.

Figure 7:
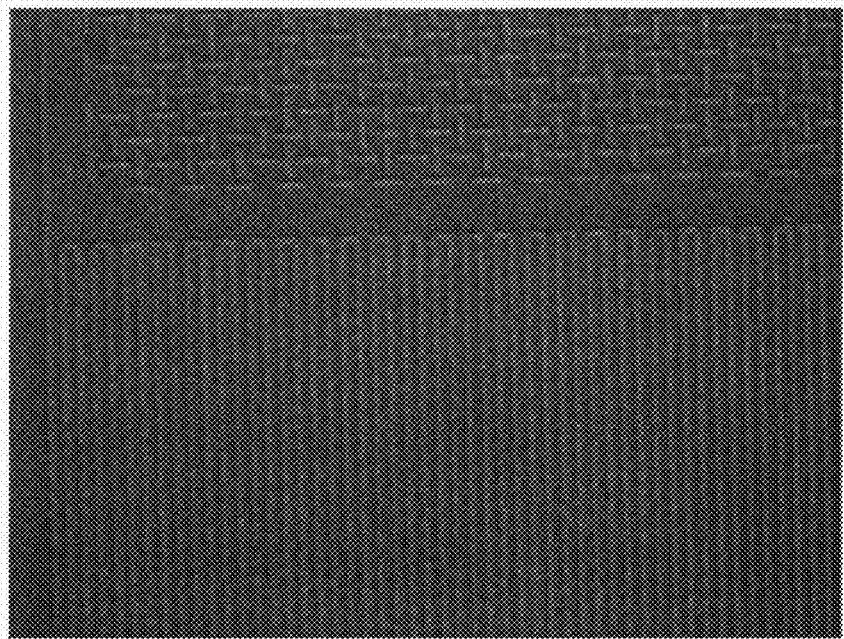
FIGS. 7A and 7B are optical micrographs of post-CMP wafers, where (A) is a serpentine structure and (B) is a Kelvin-like structure, and where a tiling pattern is customary "dummy metal" fill used to maintain constant pattern density over the entire die.
Figure 7:
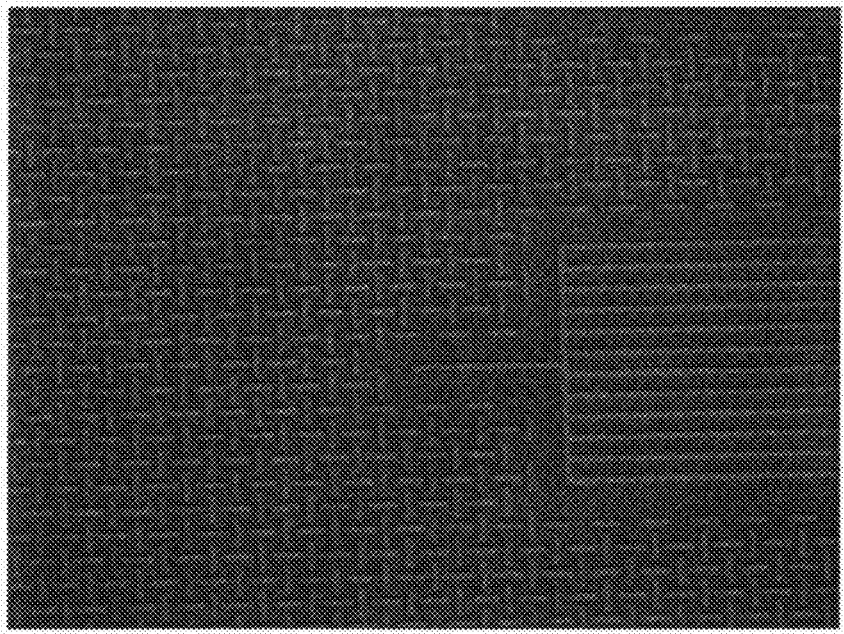
Figure 8:
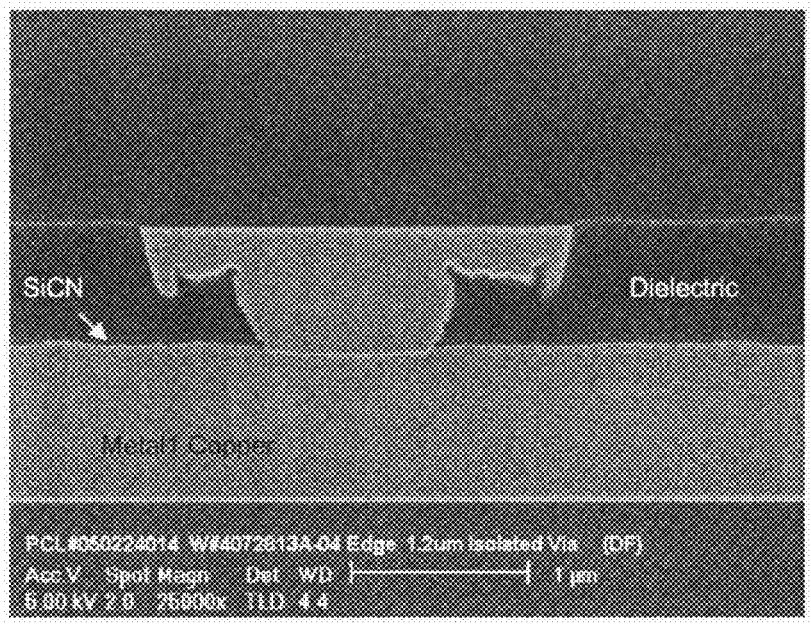
FIGS. 8A and 8B are SEM images depicting (A) a post-CMP cross-section and (B) the corresponding structure on the imprint template.
Figure 8:
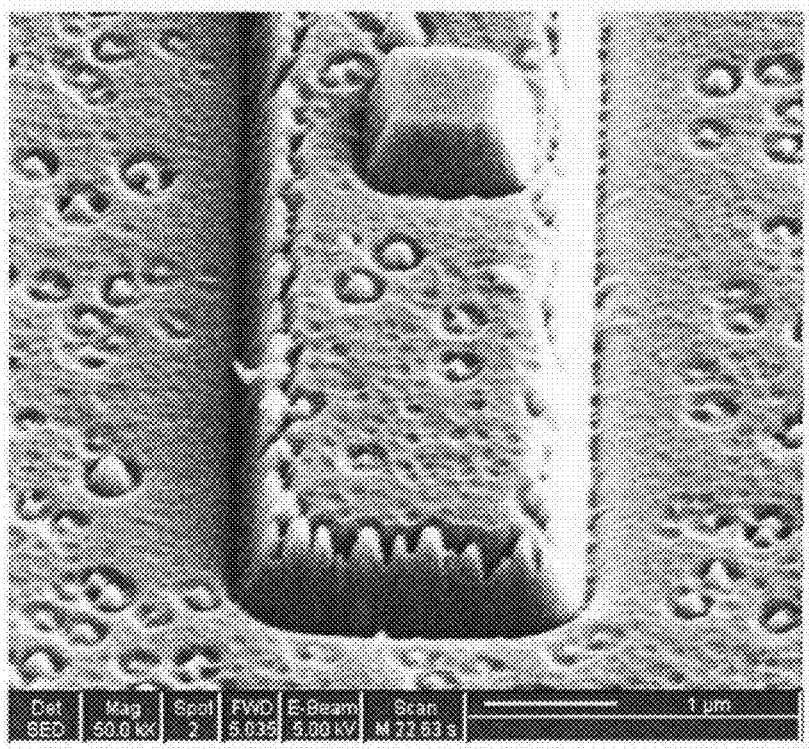

Referring to FIGS. 8A and 8B, an SEM cross-section of a post-CMP interconnect structure is presented in FIG. 8A. Roughness on the metal 2 level results from the rough template, shown in FIG. 8B, used in the initial imprint process. The cross-section of FIG. 8A is a complete demonstration of multi-tier SFIL dual damascene process. FIGS. 7 and 8 clearly demonstrates that the metal topology required for interconnect structures is present.

Example 6

This Example serves to illustrate additional suitable functional dielectric materials, in accordance with embodiments of the present invention.

Figure 9:
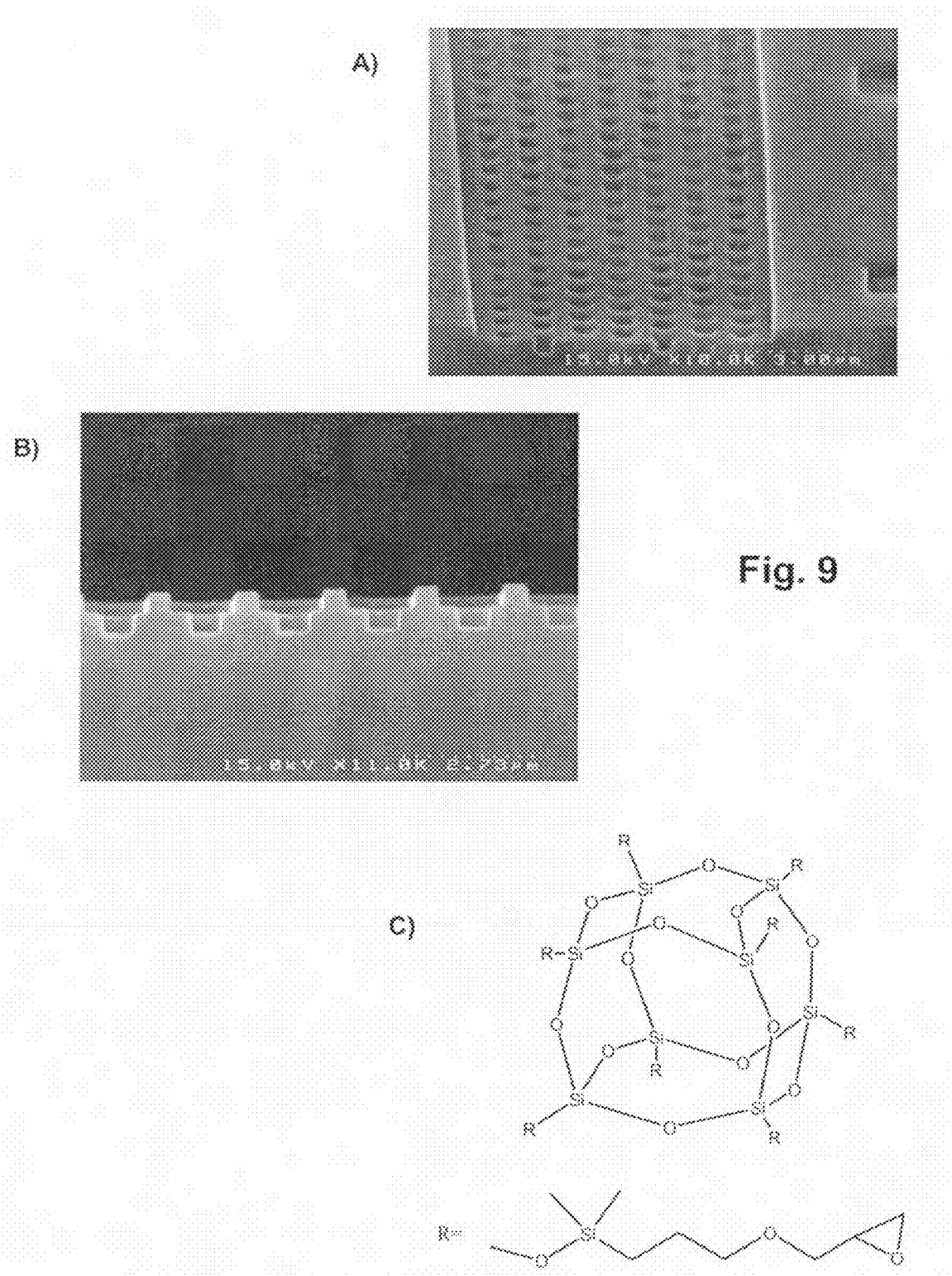
FIGS. 9A and 9B are SEM images depict imprints of cured epoxy-functionalized silsesquioxane structure (T8), the chemical structure of which is depicted in FIG. 9C.

There are several potential routes to photocurable dielectric material. One promising route is through variations of polyhedral oligomeric silsesquioxane (POSS) type materials. POSS-type materials already find use as dielectric materials in semiconductor manufacturing. Silsesquioxane polymer materials are generally too viscous for efficient SFIL processing, but by imprinting precursors and generating polymers in situ during the imprint step, a way around this problem can be found. A functionalized silsesquioxane cage structure has been imprinted (FIG. 9C) as a demonstration. FIGS. 9A and 9B are SEM images depicting imprints of cured epoxy-functionalized silsesquioxane structure (T8), the chemical structure of which is depicted in FIG. 9C. This formulation uses a photoacid generator to initiate curing rather than a free radical generator as it polymerizes through an epoxy reactive group. The material appears to lack the mechanical strength and hardness required for the dual damascene process steps.

Figure 10:
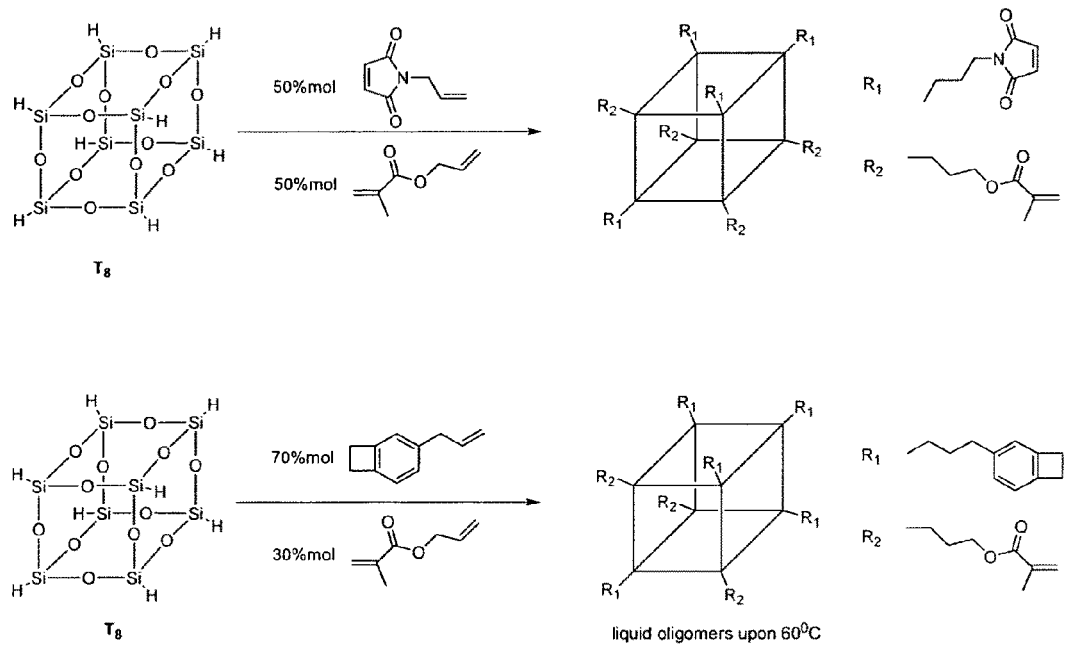
FIG. 10 is a synthetic scheme for dual-functionalized silsesquioxane cage structures suitable for use as imprint materials, in accordance with some embodiments of the present invention.

To improve the properties of this basic POSS material, POSS structures can be "dual functionalized" with different types of reactive groups such as in the scheme shown in FIG. 10 for dual-functionalized silsesquioxane cage structures suitable for use as imprint materials, in accordance with some embodiments of the present invention. Appending acrylate functional groups on to the cage structure allows curing by free radical initiated polymerization. Appending groups such as maleimide and benzocyclobutane, which cure thermally, gives a path to improved mechanical properties by post-imprint processing and allows a final material with minimal cure-induced shrinkage. The initial photo-curing step could be brief with just enough photoinduced polymerization to provide image stability and allow mold removal. Post-imprint wafers could then be baked to fully harden the material, giving improved thermal and mechanical stability as well as enhanced electrical properties. This two-step curing process allows imprint tool throughput to remain high while still ultimately meeting the required material properties. The thermally curing groups can be chosen such that they produce very little extra shrinkage on curing. Ring-opening functional groups provide low shrinkage curing reactions to produce a highly crosslinked material while inducing very little internal stress. The thermal cure process would also be compatible with the eventual incorporation of a porogen, thus providing straightforward route to an imprintable, porous low-k dielectric material.

All publications referenced herein are hereby incorporated by reference to the extent not inconsistent herewith. It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

What is claimed is:

1. A method comprising the steps of:
   a) dispensing a quantity of dielectric precursor liquid onto a substrate, wherein the substrate has been treated with an adhesion promoter;
   b) pressing a multi-tiered template into the dielectric precursor liquid as it resides on the substrate, wherein the multi-tiered template has been treated with a fill/release agent;
   c) photo-curing the dielectric precursor liquid as it resides between the substrate and the multi-tiered template to form a template-bound photo-cured multi-tiered patterned dielectric material;
   d) removing the multi-tiered template from the multi-tiered patterned dielectric material to yield a photo-cured multi-tiered patterned dielectric structure on the substrate;
   e) clearing residual material from the photo-cured multi-tiered patterned dielectric structure, wherein such material otherwise prevents contact with the underlying substrate;
   f) thermally curing/baking the photo-cured multi-tiered patterned dielectric structure to form a thermally-cured multi-tiered patterned dielectric structure;
   g) depositing copper in the thermally-cured multi-tiered patterned dielectric structure to form a filled multi-tiered patterned dielectric structure with a copper overfill layer; and
   h) removing the copper overlayer.

2. The method of claim 1, wherein the dielectric precursor material comprises dual functionalized polyhedral oligomeric silsesquioxanes to which are appended polymerizable/crosslinkable groups, wherein each dual functionalized polyhedral oligomeric silsesquioxane includes a first polymerizable/crosslinkable group that undergoes free radical initiated polymerization during photo-curing in c) and a second polymerizable/crosslinkable group that undergoes thermally-initiated polymerization during thermal curing in f).

3. The method of claim 1, wherein the adhesion promoter is organosilane-based.

4. The method of claim 1, wherein the template is lithographically-generated.

5. The method of claim 1, wherein the fill/release agent is selected from the group consisting of tridecafluoro-1,1,2,2-tetrahydroctyltrichlorosilane, hexamethyldisilazane, and combinations thereof.

6. The method of claim 1, wherein the photo-curing is carried out using UV radiation.

7. The method of claim 1, wherein the step of clearing residual material comprises a plasma etching process.

8. The method of claim 1, wherein the step of thermally curing/baking involves heating the photo-cured multi-tiered patterned dielectric material to a temperature substantially near the decomposition temperature of the dielectric material.

9. The method of claim 1, wherein the step of depositing copper involves a technique selected from the group consisting of physical vapor deposition, electroplating, and combinations thereof.

10. The method of claim 1, wherein the step of removing the copper overlayer involves a chemical mechanical planarization (CMP) process.

11. A method combining the use of step-and-flash imprint lithography (SFIL) with dual damascene processing to generate multi-tiered patterned dielectric structures from a photo-sensitive dielectric precursor liquid into which copper metal is deposited, the method further comprising photo-curing the dielectric precursor liquid and thermally curing the photo-cured multi-tiered patterned dielectric structures before depositing the copper metal, wherein the copper metal is deposited in the thermally-cured multi-tiered patterned dielectric structures.

12. The method of claim 11, wherein multi-tiered SFIL templates are used in generating multi-tiered patterned dielectric structures from photo-sensitive dielectric precursor liquid.

13. The method of claim 12, wherein the multi-tiered SFIL templates are lithographically-generated.

14. The method of claim 11, wherein the photo-sensitive dielectric precursor liquid is photo-cured through exposure to UV radiation.

15. The method of claim 11, wherein the copper metal is deposited using a technique selected from the group consisting of physical vapor deposition, electroplating, and combinations thereof using a physical vapor deposition process.

16. The method of claim 11, wherein the copper metal is further processed using a chemical mechanical planarization process.

17. A method combining the use of step-and-flash imprint lithography (SFIL) with dual damascene processing to generate multi-tiered patterned dielectric structures from a dielectric precursor liquid into which copper metal is deposited, the method further comprising photo-curing the dielectric precursor liquid to form the multi-tiered patterned dielectric structures and thermally curing the photo-cured multi-tiered patterned dielectric structures before depositing the copper metal, wherein the dielectric precursor liquid comprises dual functionalized polyhedral oligomeric silsesquioxanes to which are appended polymerizable/crosslinkable groups, wherein each dual functionalized polyhedral oligomeric silsesquioxane includes a first polymerizable/crosslinkable group that undergoes free radical initiated polymerization during photo-curing and a second polymerizable/crosslinkable group that undergoes thermally-initiated polymerization during thermal curing, and wherein the copper metal is deposited in the thermally-cured multi-tiered patterned dielectric structures.

18. The method of claim 17, wherein multi-tiered SFIL templates are used in generating multi-tiered patterned dielectric structures from the dielectric precursor liquid.

19. The method of claim 17, wherein the dielectric precursor liquid is photosensitive.

20. The method of claim 17, wherein the copper metal is deposited using a physical vapor deposition process.

21. A method comprising the steps of:
   a) dispensing a quantity of dielectric precursor liquid onto a substrate;
   b) pressing a multi-tiered template into the dielectric precursor liquid as it resides on the substrate;
   c) photo-curing the dielectric precursor liquid as it resides between the substrate and the multi-tiered template to form a template-bound photo-cured multi-tiered patterned dielectric material;
   d) removing the multi-tiered template from the photo-cured multi-tiered patterned dielectric material to yield a photo-cured multi-tiered patterned dielectric structure on the substrate;
   e) clearing residual material from the photo-cured multi-tiered patterned dielectric structure, wherein such material otherwise prevents contact with the underlying substrate;
   f) thermally curing/baking the photo-cured multi-tiered patterned dielectric structure to form a thermally-cured multi-tiered patterned dielectric structure;

g) depositing copper in the thermally-cured multi-tiered patterned dielectric structure to form a filled multi-tiered patterned dielectric structure with a copper overfill layer; and h) removing the copper overlayer.

22. The method of claim 21, wherein the dielectric precursor material comprises dual functionalized polyhedral oligomeric silsesquioxanes to which are appended polymerizable/crosslinkable groups, wherein each dual functionalized polyhedral oligomeric silsesquioxane includes a first polymerizable/crosslinkable group that undergoes free radical initiated polymerization during photo-curing in c) and a second polymerizable/crosslinkable group that undergoes thermally-initiated polymerization during thermal curing in f).

23. The method of claim 21, wherein the substrate has been treated with an adhesion promoter, and wherein the adhesion promoter is organosilane-based.

24. The method of claim 21, wherein the multi-tiered template has been treated with a fill/release agent, and wherein the fill/release agent is selected from the group consisting of tridecafluoro-1,1,2,2-tetrahydroctyltrichlorosilane, hexamethyldisilazane, and combinations thereof.

25. The method of claim 21, wherein the step of depositing copper involves a technique selected from the group consisting of physical vapor deposition, electroplating, and combinations thereof.

26. The method of claim 21, wherein the step of removing the copper overlayer involves a chemical mechanical planarization (CMP) process.

27. The method of claim 1, wherein the adhesion promoter comprises aminopropylsilane.

* * * * *